US010840691B2

United States Patent
Herazo et al.

(10) Patent No.: US 10,840,691 B2
(45) Date of Patent: Nov. 17, 2020

(54) LATERAL DISTURBANCE DETECTION AND REMOTE TRACKING OF AUTOMATIC LATERAL SWITCH OPERATIONS

(71) Applicant: Florida Power & Light Company, Juno Beach, FL (US)

(72) Inventors: Giovanni Herazo, Jupiter, FL (US); Andrew Kirby, Jupiter, FL (US); David L. Herlong, Jupiter, FL (US); Lakshmi Penmetsa, Wellington, FL (US); Andres Gomez, Hollywood, FL (US)

(73) Assignee: Florida Power and Light Company, Juno Beach, FL (US)

( * ) Notice: Subject to any disclaimer, the term of this patent is extended or adjusted under 35 U.S.C. 154(b) by 224 days.

(21) Appl. No.: 15/443,358

(22) Filed: Feb. 27, 2017

(65) Prior Publication Data

US 2018/0248352 A1 Aug. 30, 2018

(51) Int. Cl.
*H02H 3/06* (2006.01)
*H02H 1/00* (2006.01)
(Continued)

(52) U.S. Cl.
CPC .......... *H02H 3/063* (2013.01); *G01R 19/2513* (2013.01); *G01R 31/3275* (2013.01);
(Continued)

(58) Field of Classification Search
CPC ........... H04Q 2209/00; H04Q 2209/10; H04Q 2209/20; H04Q 2209/30; H04Q 2209/40;
(Continued)

(56) References Cited

U.S. PATENT DOCUMENTS 5,680,324 A * 10/1997 Schweitzer, III ........ H02H 3/00
340/870.02
7,308,370 B2 * 12/2007 Mason, Jr. ............. G01D 4/004
340/870.02
(Continued)

FOREIGN PATENT DOCUMENTS

| AU | 673298 | 5/1995 |
| CA | 2885185 | 4/2014 |
| CA | 2913010 | 11/2014 |

OTHER PUBLICATIONS

Transmission & Distribution World, "Automatic Circuit Recloser Features Allow Replacement of Traditional Load-Break Switches", Aug. 6, 2013, http://tdworld.com/testmonitorampcontrolautomatic circuitrecloserfeaturesallowreplacmenttraditionalloadbreak, pp. 1-3.
(Continued)

*Primary Examiner* — Franklin D Balseca
(74) *Attorney, Agent, or Firm* — Jeffrey N. Giunta; Fleit Intellectual Property Law

(57) ABSTRACT

Systems and methods to detect Automatic Lateral Switch operations. Power down reports indicating power went down at a subset of reporting power meters during a time duration is received, at a monitoring facility. The plurality of reporting power meters receive power from a lateral power feed receiving power through an Automatic Lateral Switch. A respective power restore report indicating power is restored at the respective reporting power meter is received within a recovery time duration after receiving each respective power down report. Based on receiving the respective power restore report within the recovery time duration, an occurrence of an Automatic Lateral Switch operation which includes operating contacts providing power to the lateral power feed by the contacts opening and remaining reclosed is determined. Based on determining the Automatic Lateral
(Continued)

Switch operation, an indication of the Automatic Lateral Switch operation is stored into a database system.

21 Claims, 5 Drawing Sheets

(51) Int. Cl.
    *H02H 3/08*     (2006.01)
    *G01R 31/327*     (2006.01)
    *G01R 19/25*     (2006.01)
    *H04Q 9/00*     (2006.01)

(52) U.S. Cl.
    CPC ............ *H02H 1/0092* (2013.01); *H02H 3/08* (2013.01); *H04Q 9/00* (2013.01); *H04Q 2209/00* (2013.01); *H04Q 2209/60* (2013.01); *H04Q 2209/82* (2013.01)

(58) Field of Classification Search
    CPC ........... H04Q 2209/60; H04Q 2209/80; H04Q 2209/82; H04Q 2209/823; H04Q 2209/826; H04Q 9/00; H02H 3/063; H02H 3/08; H02H 1/0092; G01R 21/133; G01R 31/3275; G01R 31/40; G01R 19/2513; G05B 15/02
    See application file for complete search history.

(56) References Cited

U.S. PATENT DOCUMENTS

| | | | |
|---|---|---|---|
| 7,460,347 B2 | 12/2008 | Schweitzer, III et al. | |
| 8,275,485 B2 | 9/2012 | Schweitzer, III et al. | |
| 8,462,014 B1 * | 6/2013 | Kardos | H02J 13/00001 340/870.02 |
| 8,476,874 B2 | 7/2013 | Labuschagne et al. | |
| 8,526,156 B2 | 9/2013 | Schweitzer | |
| 8,554,385 B2 | 10/2013 | Donolo | |
| 8,554,739 B2 | 10/2013 | Lee et al. | |
| 8,621,117 B2 | 12/2013 | Stoupis et al. | |
| 8,792,217 B2 | 7/2014 | Shah et al. | |
| 8,861,155 B2 | 10/2014 | Rostron | |
| 8,892,375 B2 | 11/2014 | Taft | |
| 9,007,731 B2 | 4/2015 | Finney et al. | |
| 9,099,858 B2 | 8/2015 | Bush et al. | |
| 9,136,692 B2 | 9/2015 | O'Regan et al. | |
| 9,383,735 B2 | 7/2016 | Schweitzer, III et al. | |
| 9,413,156 B2 | 8/2016 | O'Brien et al. | |
| 9,479,393 B2 | 10/2016 | Lee et al. | |
| 9,489,832 B2 * | 11/2016 | Nair | G08C 17/02 |
| 9,557,720 B1 * | 1/2017 | Woods | G01R 19/02 |
| 2005/0097373 A1 | 5/2005 | Stoupis et al. | |
| 2005/0151659 A1 | 7/2005 | Donovan et al. | |
| 2008/0077336 A1 | 3/2008 | Fernandes | |
| 2013/0158734 A1 | 6/2013 | Jhang | |
| 2013/0338945 A1 * | 12/2013 | Feng | H02J 13/0055 702/58 |
| 2015/0035681 A1 | 2/2015 | Bryson, Jr. et al. | |
| 2015/0134135 A1 | 5/2015 | Wong et al. | |
| 2015/0270653 A1 | 9/2015 | O'Regan et al. | |

OTHER PUBLICATIONS

Siemens, "Siemens launches vacuum recloser for the medium voltage system market", May 30, 2008, http://www.siemens.com/press/en/pressrelease/?press=/en/pressrelease/2008/power_distribution/epd200805036.htm&content[]=IPD&content[]=ICLMV&content[]=EM, p. 1.

Flynn, B.R., "Key Smart Grid Applications", Protection and Control Journal, Jul. 2009, pp. 1-6.

Transmission & Distribution World, "Colombia to use Automatic Circuit Reclosers for Smart Grid", Jul. 7, 2015, http://tdworld.com/smart-grid/colombia-use-automatic-circuit-reclosers-smart-grid, pp. 1-3.

* cited by examiner

LATERAL DISTURBANCE DETECTION AND REMOTE TRACKING OF AUTOMATIC LATERAL SWITCH OPERATIONS

FIELD OF THE DISCLOSURE

The present disclosure generally relates to monitoring electrical power distribution systems, and more particularly to monitoring activations or operations of fault protection devices in power distribution systems.

BACKGROUND

Electrical power distribution systems generally distribute electrical power to various facilities over a large geographical area. The structure of these electrical power distribution systems includes distribution lines that are referred to as lateral power feeds. These lateral power feeds are above ground or underground conductors in an example that deliver what is referred to as medium or low voltage electrical power to customer premises. Lateral power feeds have a maximum electrical current rating and include overcurrent protection devices that disconnect electrical power from portions of lateral power feeds that are drawing current in excess of their maximum electrical current rating. A lateral power feed that is drawing more than its maximum electrical current rating is referred to herein as having an overcurrent condition. Overcurrent conditions are able to be caused by a variety of factors, but are often causes by a relatively low resistance conductive path from the lateral power feed to ground or another electrical conductor. Such a relatively low resistance conductive path is referred to as a fault and may be caused by, for example, a tree or other vegetation making contact with a power line, a power line falling to the ground or making contact with another structure, other causes, or combinations of these. In some occurrences, faults causing overcurrent conditions on a lateral power feed can clear themselves after a short time and allow electrical power to be restored to that lateral power feed.

Disconnecting a lateral power feed due to an overcurrent condition results in the loss of electrical power for all premises receiving power from that lateral power feed. Some lateral power feeds have overcurrent protection devices called reclosers that open the electrical connection to a downstream lateral power feed when an overcurrent condition is detected, but make several attempts to relcose the electrical connection and restore power to the downstream lateral power feed receiving power through that relcoser. If the overcurrent condition persists after reclosing restores power to the downstream lateral power feed, the connection is reopened. After a set number of tries, the recloser stops attempting to restore power and the connection to the lateral power feed remains open until a repair crew inspects the situation and makes required repairs.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
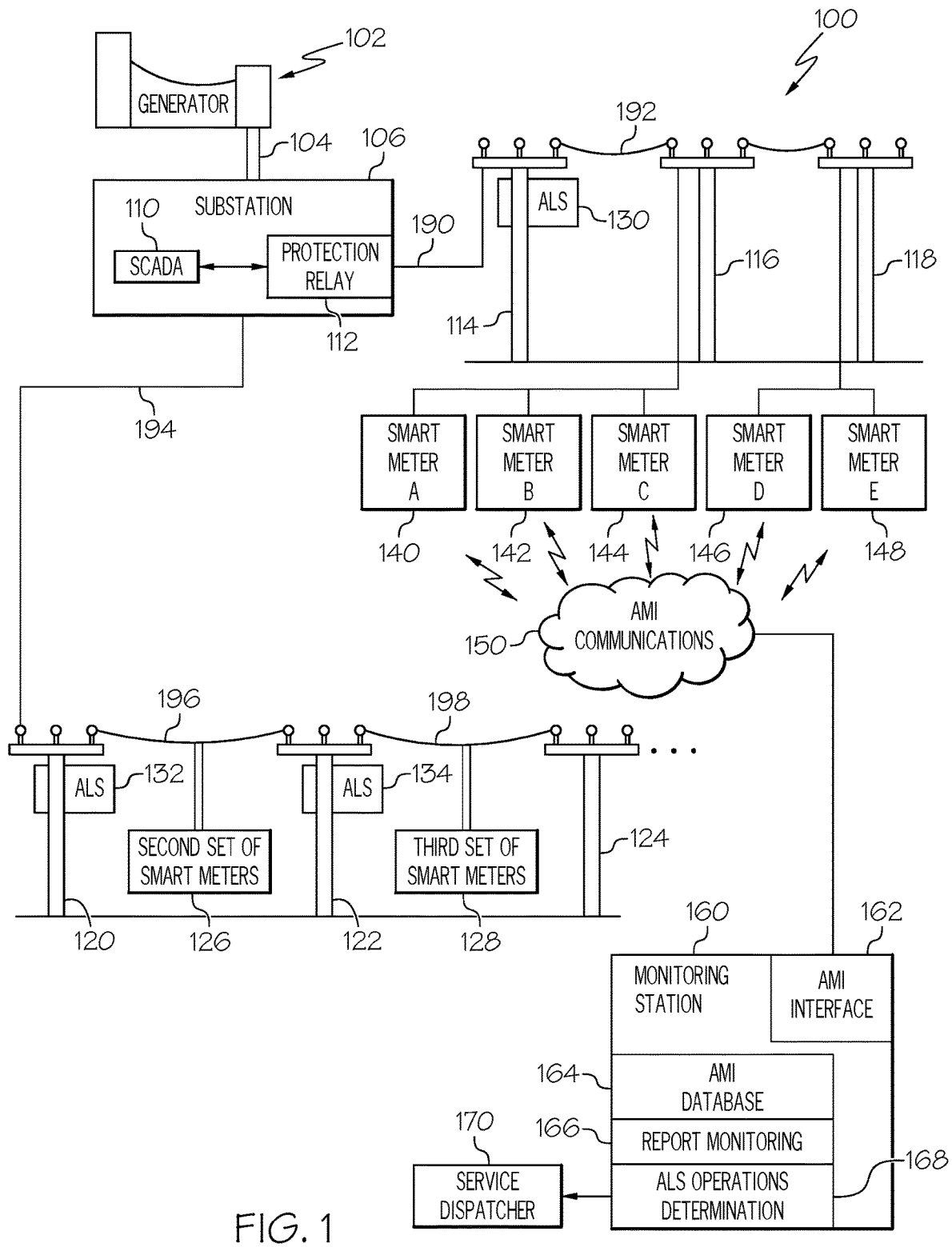
FIG. 1 illustrates an example distribution system 100, according to an example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The below described systems and methods monitor the operations of Automatic Lateral Switches (ALSs) that are installed in a power distribution system and that do not have a capability to communicate their status to a monitoring station. ALS devices are overcurrent protection devices that are installed in electrical power distribution systems to isolate lateral power feeds that exhibit overcurrent conditions but that also attempt to reapply electrical power in an attempt to restore power if possible. An ALS is generally positioned in a power distribution system to receive power from an upstream power source and provide power to a downstream lateral power feed. In some examples, a lateral power feed is able to have a number of ALS devices along the line, where the ALS will open to disconnect its downstream lateral power feed when an overcurrent conditions is present.

An example of an ALS is a power circuit recloser device, or reclosing over current protection device, that has programmable logic and automated electrical current monitoring components to more precisely monitor electrical current flowing through to the lateral power feed receiving power from the ALS. When an overcurrent condition through the ALS is determined to exist, the ALS opens the electrical circuit to stop electrical current flow to the lateral power feed and then attempts to reclose the electrical circuit a few times in order to see if the overcurrent condition has stopped.

The below systems and methods in an example use reports of the state of power on lateral power feeds to determine if an ALS has opened and then remained reclosed after an initial overcurrent condition is detected. In an example, the state of power on lateral power feeds is monitored based on reports received from smart meters or other measurement devices delivered via an Advanced Metering Infrastructure (AMI). In the following examples, smart meters are examples of reporting power meters. In an example, smart meters are installed at various customer facilities that measure and automatically report parameters of electric power delivered to those facilities. In addition measuring and reporting electrical power consumed by the customer facilities, these smart meters are able to measure the line voltages delivered to the smart meter. The smart meter in an example periodically measures and reports these various parameters via an Advanced Metering Infrastructure (AMI) communications network to a monitoring station. In an example, the monitoring station receives data with these measurements and processes that data for various purposes.

The below systems and methods in an example receive various power status messages that are reported by smart meters or other equipment that measures power line status and report those measurements over an AMI network. In one example, various smart meters monitor the status of power delivered to the meter and when power is lost, a power down message is immediately sent over the AMI network indicating that the power went down. An example of such a power down message is a "last gasp" message that a smart meter will send out when power is lost. In an example, a smart meter will determine every ten milliseconds (10 ms) if power is present on the feed into the smart meter monitor. In an example, such a smart meter will send a last gasp message via the AMI network to a monitoring station if it is determined that power has not been present for one hundred milliseconds (100 ms). When power is again delivered to the power meter, a power up message is send from the meter via the AMI network to the monitoring station.

In an example, status reports received through the Advanced Metering Infrastructure (AMI) network are monitored and analyzed to identify a pattern of status reports that are likely to indicate a likely ALS operation. In an example, power down and power restore reports from smart meters or other monitoring devices communicating via an AMI network. In an example, observing that a power down report followed by a power restore report within a relatively short time period may be caused by the power meter receiving power through an ALS that open and then remained reclosed after the overcurrent condition cleared. In an example, a number of smart meters that all receive power from a particular ALS that send a power down report followed by a power restore report within a specified time period is able to support a determination that the particular ALS did open and then remained reclosed after the overcurrent condition cleared. The specified time period in which to receive these power down and power restore pairs in an example is based on the time that an ALS device attempts to reclose the circuit after detecting an overcurrent condition. In an example, the specified time period is sixty (60) seconds. If a power restore report is received in this time period, the cause of the overcurrent condition is assumed to have cleared because if the overcurrent condition had persisted, when the ALS recloses the connection it will reopen before the smart meter could determine and report that the power had been restored.

In some examples, determining that a particular ALS did open and then remained reclosed after the overcurrent condition cleared is based on receiving a power down and power restore status message pair from a certain percentage of all of the smart meters or other measurement devices that are receiving power from that particular ALS. In an example, such a determination is made when more than fifty percent (50%) of smart meters or other measurement devices that receive power from the particular ALS send a power down and power restore status message pair. In an example, such a determination is made when five (5) or more smart meters or other measurement devices that communicate via the AMI network receive power from the particular ALS. In an example, these measurements are also made based on reports received from smart meters or other measurement devices that receive power from a single phase lateral power feed. In an example, status reports from smart meters or other measurement devices on the AMI network that indicate that more than one ALS is likely to have opened and remain reclosed are not recorded or acted upon.

In some examples, analysis of status reports indicating that a particular ALS is likely to have opened and remained closed is also able to include data received from Supervisory Control And Data Acquisition (SCADA) devices located at a substation that is provides electrical power to that particular ALS. For example, a determination based on analysis of status reports indicating that a particular ALS is likely to have opened and remained closed may be affected by received SCADA system reports that indicate that a protection relay driving a lateral power feed that provides power to a particular ALS also operated during the time period in which the ALS is determined to have opened and remained closed. In an example, when the SCADA indicates that such a protection relay did operate, the determination of ALS operation is discarded. In some examples, determinations that a particular ALS is likely to have opened and remained closed are able to be integrated with other maintenance management systems, such as a system that manages trouble tickets. For example, a customer report from one location that power is lost intermittently is able correlated with a determination that an ALS providing power to that location is likely to have opened and remained closed. In such a case, the trouble ticket for intermittent power loss is able to be replaced with a notice of ALS operation and noting possible repairs needed for the lateral power feed to which the ALS is providing power.

Determinations that an ALS is likely to have opened and remained closed are stored in some examples for later analysis. In an example, such analyses are able to assist reliability programs in addressing and investigating electrical equipment issues. In an example, the lifecycle of installed ALS is able to be predicted based on detected ALS operations. In an further example, such analyses could also determine when particular ALS devices operate more frequency and direct vegetation trimming activities to more frequency trim vegetation along lateral power feeds that receive power from those ALS devices.

FIG. 1 illustrates an example distribution system 100, according to an example. The example power distribution system 100 presents a simplified depiction of an electrical power distribution system in order to more concisely describe the relevant aspects of the below described systems and methods. It is to be understood that the below described systems and methods are readily implemented in the context of much more complex electrical power distribution systems that receive power from many generators and provide electrical power to many customer premises over a large geographical area.

In the depicted example distribution system 100, a generator 102 generates electrical power and provides the generated electrical power to an electrical transmission/distribution system 104. The generator 102 is able to be any suitable type of generator that receives energy in any form including, for example, solar, wind power, fossil fuel, nuclear, other forms of energy, or combinations of these. In general, an electrical power transmission/distribution system 104 is able to operate with any number of generators that are connected to various combinations of one or more transmission and/or distribution systems of various complexity levels. The transmission and/or distribution systems in an example convey electrical power in the form of three-phase Alternating Current (AC) that in some instances is at a voltage that is generally higher than the voltage delivered to electric power customers.

The illustrated transmission/distribution system 104 provides electrical power to a substation 106. In an example, the substation 106 provides electrical power to a number of feeder lines, such as a first lateral power feed 192 and a second lateral power feed 196, via feeder lines, such as a first feeder line 190 and a second feeder line 194. The illustrated example presents a simplified power distribution line topology in order to more clearly present the relevant aspects of the systems and methods described below.

In the illustrated example, the substation 106 provides electric power to the first feeder line 190 through a protection relay 112. The protection relay 112 operates to protect the first feeder line 190, and any other circuits to which the first feeder line 190 provides electric power, from an overcurrent condition. The substation 106 in this example, has a Supervisory Control And Data Acquisition (SCADA) system 110 that monitors various conditions and operations of equipment in or near the substation 106. In the illustrated example, monitoring performed by the SCADA system 110 includes monitoring operations of the protection relay 112. In an example, the SCADA system 110 sends indications to a monitoring station that the protection relay 112, which is an example of an overcurrent protection device, opened to remove electrical power from power feeder such as the first feeder line 190.

The first feeder line 190 provides electrical power to the first lateral power feed 192 through a first ALS 130. The first ALS 130 is shown to be installed on a first power pole 114. In the illustrated example, the first feeder line 190 runs from the substation 106 to the first power pole 114 and the first lateral power feed 192 extends from the first power pole 114, to a second power pole 116 and on to a third power pole 118. In general, a feeder line is able to extend over a long distance and provide power to any number of lateral power feeds.

The first lateral power feed 192 extends from the first power pole 114 to the second power pole 116. At the second power pole 116, the first lateral power feed 192 has connections to three smart meters, smart meter A 140, smart meter B 142, and smart meter C 144. As is understood by practitioners of ordinary skill in the relevant arts, smart meters perform various measurements on the electrical power that they receive from the lateral power feed to which they are connected. The first lateral power feed 192 further extends to a third power pole 118, where it has connections to smart meter D 146 and smart meter E 148.

These smart meters communicate their measurements and other data via reports sent through an Advanced Metering Infrastructure (AMI) network 150. The AMI network 150 relays these reports to a monitoring station 160. In addition to measuring and reporting the amount of electrical power flowing through each smart meter, each smart meter monitors whether electrical power is present at the meter. When power is observed to be lost, each smart meter reacts by sending a "last gasp" message indicating that power has gone down or been lost. If that smart meter determines that power is restored after determining that the power went down, the smart meter sends a power restore message to the monitoring station 160.

A second feeder line 194 is shown as extending from the substation 106 to the fourth power pole 120. The second feeder line 194 is connected to and provides power to a second ALS 132. The second ALS 132 provides electrical power to a second lateral power feed 196 that is shown to be between the fourth power pole 120 and a fifth power pole 122. The second lateral power feed 196 is connected to a second set of smart meters 126. The second feeder line 196 is also shown to have a connection to and provide power to a third ALS 134 that further provides power to a third lateral power feed 198. The third lateral power feed 198 is connected to a third set of smart meters 128. In general, both of the second lateral power feed 196 and the third lateral power feed 198 each have connections to and provide electric power to sets of smart meters that include at least five smart meters (not individually shown). These smart meters each report power status, such as power down reports and power restore reports, to the monitoring station 160. In an example, reports from smart meters in the second set of smart meters 126 and the third set of smart meters 128 are sent via the AMI network 150 and are received by the monitoring station 160 and processed to determine when the second ALS 132 or the third ALS 134 has opened and then successfully reclosed.

The illustrated first lateral power feed 192 delivers power to five smart meters that receive power through the first ALS 130. When the first ALS 130 opens the connection between the first feeder line 190 and the first lateral power feed 192, all of the power meters receiving power from the first lateral power feed 192 will determine that the power is down and send a power down report, such as a "last gasp" message, through the AMI network 150. Due to limitations of the AMI network 150 and the situation where many smart meters will send reports at about the same time (since power is lost at all meters on the first lateral power feed 192 when the first ALS 130 opens), some reports will not be successfully communicated through the AMI network 150, and thus the monitoring station 160 does not receive a power down report from all of the smart meters on the first lateral power feed 192. As is described in further detail below, operations where an ALS opens and remains reclosed is determined in some examples by processing received power down reports from a subset of all of the smart meters receiving power from that ALS as well as element that are not downstream from the first ALS 130, such as upstream breaker relay 112 and/or smart meters that are not downstream from the first ALS, such the second set of smart meters 126.

The monitoring station 160 in an example includes an automated computer processor that performs various functions as are described below. In some examples, the monitoring station 160 is able to physically house computing processors to perform at least some of the below described processing. In some examples, the monitoring station 160 is in communications with remote processors that perform some or all of the below processing. For example, some or all of the below described processing is able to be performed by remotely hosted processors, including virtual processors, that are in data communications with various components of the example distribution system 100. It is to be understood that the processing described herein is able to be performed by any suitable processing architecture that includes local processors, remote processors, a combination of local and remote processors that interact with each other, any other processing architecture, or combinations of these.

The monitoring station 160 in an example includes a processor that receives, via the AMI network 150, reports from smart meters connected to various lateral power feeds reporting electrical meters communicating over a communications network, such as the AMI network 150, that provides communications among a number of reporting electrical meters and the processor at the monitoring station 160.

The monitoring station 160 includes an AMI interface 162. The AMI interface 162 is an interface to the AMI network 150 and is able to send and receive data between one or more processors located at or accessible to the monitoring station 160 and any smart meter that is also in communications with the AMI network 150. The AMI interface 162 is an example of a communications network interface coupled to a processor, memory, and communications network providing communications among a number of reporting electrical meters and one or more of those processors. In various examples, the AMI interface 162 receives measurements and other data from smart meters located at various customer premises, and is also able to send commands or other configuration data to one or groups of those smart meters to individually control the operation of the various smart meters.

The monitoring station 160 in an example includes various components to store, accumulate, perform various processes, or combinations of these, the measurements and data received from various smart meters connected through the AMI network 150 as well as based on data received from other sources. The monitoring station 160, or other facility in communications with the AMI network 150, is also able to alter various configuration parameters of one or more smart meters that are connected to the AMI network 150.

The monitoring station 160 includes a number of data storage and data analysis components. In the illustrated example, the monitoring station 160 includes an AMI database 164 that stores data received from the multiple smart meters that communicate with the monitoring station 160 via the AMI network 150. The AMI database 164 is an example of a database of data reported by reporting electrical meters.

The illustrated monitoring station 160 also includes a report monitoring component 166. As described in further detail below, the report monitoring component 166 performs processing of data reported by smart meters at various locations to determine if the power line conditions at that smart meter indicate that an ALS supplying power to that smart meter is likely to have opened and remain reclosed. In various examples, the report monitoring component 166 is able to receive data reported by smart meters through the AMI interface 162, as that data is received from the smart meters. In some examples, the report monitoring component 166 is able to receive smart meter data that was previously reported and is stored in the AMI database 164. A processor performing as the report monitoring component 166, such as is present in one or more computing resources located at or in communications with the monitoring station 160 is able to include a report monitoring processor that performs at least part of the processing described below.

The illustrated monitoring station 160 also includes an ALS operations determination component 168. As described in further detail below, the ALS operations determination component 168 performs processing to determine if it is likely that a particular ALS is likely to have opened and remain reclosed. In some examples, the ALS operations determination component 168 performs processing to determine a pattern of occurrences of ALS operations and sends indications of required service for lateral power feeds supplied by a particular ALS. In some examples, the ALS operations determination component 168 performs processing to determine that a particular ALS is approaching the end of its lifecycle. In some examples, the ALS operations determination component 168 provides indications to plan or perform the replacement of an operational ALS that is nearing the end of its lifecycle. In an example, such indications can include or be in the form of a service ticket sent to a service dispatcher as is described below. A processor performing as the ALS operations determination component 168, such as is present in one or more computing resources located at or in communications with the monitoring station 160 is able to include a ALS operations determination processor that performs at least part of the processing described below.

The monitoring station 160 in an example communicates with a service dispatcher 170. The service dispatcher 170 is able to, for example, dispatch a service truck with service personnel to investigate conditions that might be associated with ALS operations, such as intermittent faults causing an ALS to open and remain reclosed. In the illustrated example, the service dispatcher 170 is an example of customer service systems that is able to receive an indication, such as a service ticket, of required service for a lateral power feed.

Figure 2:
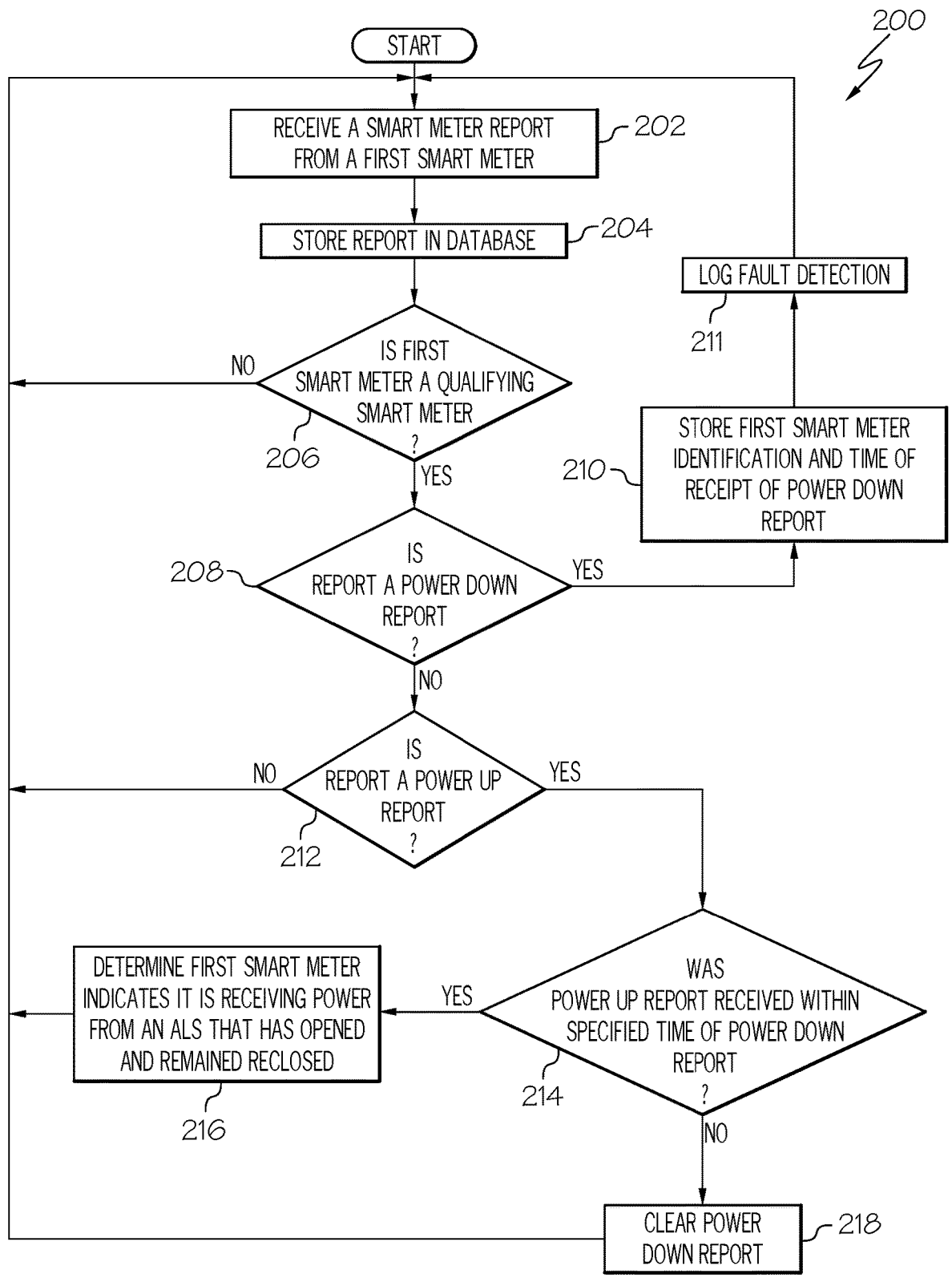
FIG. 2 illustrates a smart meter report monitoring process 200, according to an example.

FIG. 2 illustrates a smart meter report monitoring process 200, according to an example. The smart meter report monitoring process 200 is an example of a process performed by the above described report monitoring component 166 based upon reports received from a single smart meter to identify power line transitions that may be caused by operations of an ALS opening and remaining reclosed. The smart meter report monitoring process 200 determines that power supplied to a particular smart meter may indicate that an ALS providing power to that smart meter has opened and remained closed. In an example, iterations of the smart meter report monitoring process 200 are used to similarly process reports from a number of smart meters. The determinations made by the many iterations of the smart meter report monitoring process 200 are further processed, as is described below, to determine a likelihood that a particular ALS has opened and remained reclosed.

The smart meter report monitoring process 200 begins by receiving, at 202, a smart meter report from a first smart meter. In an example, such reports are received via the AMI network 150 described above. In an example, this receiving is an example of receiving, at a monitoring facility from each respective reporting power meter in a subset of reporting power meters within a plurality of reporting power meters. Received reports are stored in a database, at 204. In an example, these reports are stored in the AMI database 164 described above. The data stored in the database is able to be analyzed for various purposes. An example of an analysis of stored reports is described below.

A determination is made, at 206, as to whether the first smart meter from which the report was received is a qualifying smart meter for the purposes of monitoring ALS operations. In an example, only reports from smart meters that are single phase smart meters are used to determine if an ALS is likely to have opened and remained reclosed. Further, reports are only considered that are received from smart meters that receive electric power through an ALS that also supplies electric power to at least five (5) smart meters.

If the first meter is determined to be a qualifying smart meter, a determination is made, at 208, if the report is a power down report. Power down reports in various examples are able to be any report sent by a smart meter that indicates that the electrical power delivered to the smart meter is lost. In an example, a "last gasp" message received from a smart meter is a power down report. Other reports that indicate voltage drops below a specified level, such as fifty percent (50%) of rated voltages, are also able to be determined to be power down reports. If the report is determined to be a power down report, an identification of the smart meter and the time of receipt of the power down report are stored in some examples, at 210. In some examples, the storing of this information at this point is a local storage of data to be used by processing to determine whether an ALS has operated. Storing this information facilitates a later processing, described below, regarding determining the timing between power down reports and power restore reports. In some examples, the database storage into which smart meter reports are stored, as is described above, is able to be used by this and related processing. In some examples, a fault for the lateral power feed associated with the first smart meter is logged, at 211. This logging is able to be used to monitor activity on that lateral power feed and allows analysis of patterns of when power on that lateral power feed is lost Returning to determining if the report is a power down report, at 208, if it is determined to not be a power down report, a determination is made, at 212, as to whether the report is a power restore report. Power restore reports are able to be any report that indicates power has returned to the first smart meter. If it is determined the report is not a power up report, and it was earlier determined to not be a power down report, the report in one example is not used by processing associated with monitoring ALS operations involving opening and remaining reclosed. These reports in various examples are able to be used by other processing components.

If it is determined that the report is a power restore report, a determination is made, at 214, as to whether the power up report was received within a specified time of receiving the power down report. The time of receipt of the power down report was stored as described above in an example, at 211. In further examples, the time of the power down report is able to be retrieved from the database storage of received smart meter messages. In some examples, the specified time between receiving the power down report and the power restore report is based on the time it takes for an ALS to complete its reclosing cycle. In an example, a specified time of sixty (60) seconds is used.

If it is determined that the power restore report was received within the specified time, it is determined, at 216, that the first smart meter indicates that it is receiving power from an ALS that has opened and remained reclosed. In an example, receipt of a power restore report from a smart meter indicates that the recloser has remained reclosed and the cause of the overcurrent condition has cleared. The cause of the overcurrent condition is assumed to have cleared because if the overcurrent condition had persisted, the ALS would have reopened before the smart meter would determine and report that the power had been restored.

If it is determined that the power restore report was not received within the specified time, the power down report is cleared in an example from local storage, at 218. In an example, the data about a previously received power down report was stored, at 211, and that stored data is cleared at this stage.

After clearing the power down report, at 218, determining the first smart meter indicates it is receiving power from an ALS that has opened and remained reclosed, at 216, determining that the report is not a power restore report, at 212, or the report is not from a qualifying smart meter, the smart meter report monitoring process 200 reiterates and receives, at 202, a smart meter report from another first smart meter.

Figure 3:
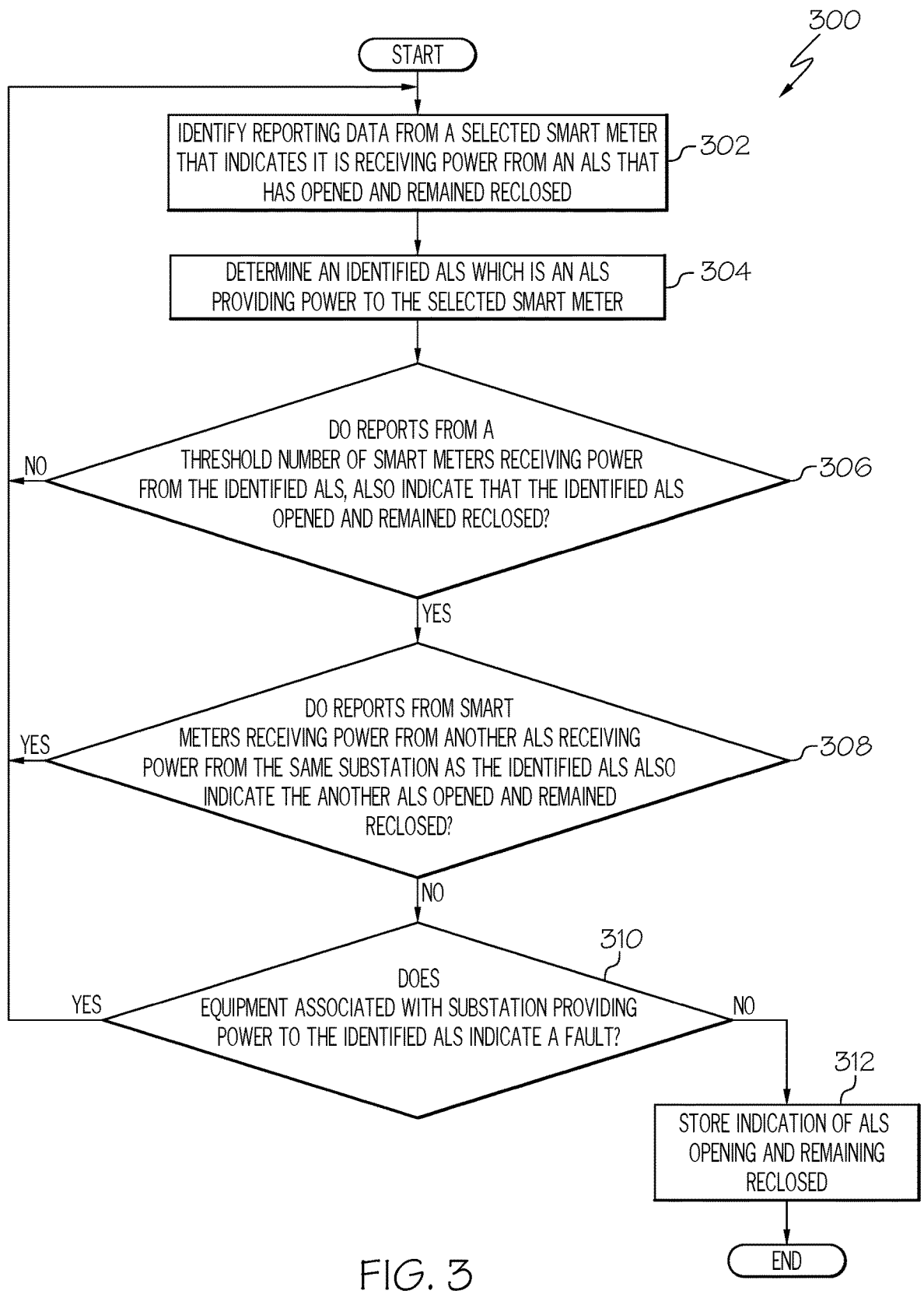
FIG. 3 illustrates an ALS operations determination process 300, according to an example.

FIG. 3 illustrates an ALS operations determination process 300, according to an example. The ALS operations determination process 300 is an example of a process to determine whether a particular ALS is likely to have operated by opening and remaining reclosed. The ALS operations determination process 300 in an example processes determinations that a smart meter is receiving power from an ALS that has opened and remained reclosed, such as by the above described smart meter report monitoring process 200.

The ALS operations determination process 300 begins by identifying, at 302, that reporting data from a selected smart meter indicates it is receiving power from an ALS that has opened and remained reclosed. This identification is able to be made by, for example, determinations produced by the smart meter report monitoring process 200 described above. This identification is able to be made in various examples based on processing reports from smart meters as those reports are received, or based on processing reports that retrieves previously received reports that were stored in a database.

The ALS providing power to the selected smart meter is determined, at 304. The ALS providing power to the selected smart meter is referred to herein as an identified ALS. This determination in an example is based on data defining the power distribution system topology to identify the ALS providing power to the smart meter reporting power down and power restore events.

A determination is made, at 306, as to whether a threshold number of smart meters receiving power from the identified ALS also indicate that the identified ALS has opened and remained reclosed. In some examples, the AMI network 150 may not be able to reliably communicate a large number of power down reports, such as may occur when an ALS opens and removes power from a large number of smart meters. In order to accommodate this characteristic of the communications channel between the reporting smart meters and a monitoring station, the ALS operations determination process 300 determines likely operations of ALS devices based on reports from only a subset of all of the smart meters that would be expected to report opening, and subsequent reclosing, of a particular ALS. In an example, a threshold of fifty percent (50%) of all smart meters receiving power from a particular ALS is used. In that example, receiving power down, and subsequent power up, reports from 50% or more of all smart meters receiving electrical power from an ALS will cause the determination at 306 to be true. In an example the set of all smart meters receiving electric power from an ALS is determined based on data defining the power distribution system topology which identifies electrical connections between ALS devices, smart meters, and other components of the electrical distribution system.

If reports from a threshold number of smart meters is determined to be received, a determination is made, at 308, as to whether reports from a second set of smart meters receiving power from another ALS that is also receiving power from the same substation also indicates that the other ALS also opened and remained reclosed. With reference to the example distribution system 100, an example of another ALS is the second ALS 132, and an example of the second set of smart meters, which is a second plurality of smart meters, is the second set of smart meters 126. Such operation of another ALS may cause observations about operations of the selected ALS to be unreliable. In an example, monitoring to determine that the second ALS has operated its contacts providing power to the lateral power feed include receiving, from each respective reporting power meter in a second subset of reporting power meters within the second plurality of reporting power meters, a respective power down report indicating power went down at the respective reporting power meter in the second subset of reporting power meters during the time duration, and receiving, within the recovery time duration after receiving each respective power down report from each respective reporting power meter in the second subset of reporting power meters, a respective power restore report indicating power is restored at the respective reporting power meter in the second subset of reporting power meters.

If it is determined that reports from smart meters don't indicate another ALS has opened and reclosed, a determination is made, at 310, as to whether equipment associated with the substation providing power to the identified ALS indicates a fault. In an example, an indication of a fault is able to include SCADA equipment at the substation sending an indication that a protection relay at the substation has opened. Such an indication in some examples may cause determinations about ALS operations based on smart meter reporting to be less reliable. In an example, the monitoring station 160 monitors for receipt of an indication that the overcurrent protection device that drives a power feed, such a protection relay, opened during a fault clearing time interval comprising the time duration and the recovery time duration after receiving the respective power down report.

If it is determined that equipment associated with the substation did not indicate a fault, an indication is stored, at 312, of an ALS opening and remaining reclosed. In some examples, further actions, such as initiating a service action to inspect the lateral power feed that caused the ALS operation may also be performed at this stage. The ALS operations determination process 300 in an example then ends.

If it was determined that the equipment associated with the substation indicated a fault, at 310, that other ALS devices may also have operated, at 308, or that reports from the threshold number of smart meters weren't received, at 306, the ALS operations determination process 300 assumes the selected ALS did not open and remain reclosed and then reiterates the above processing by processing data from other smart meters.

Figure 4:
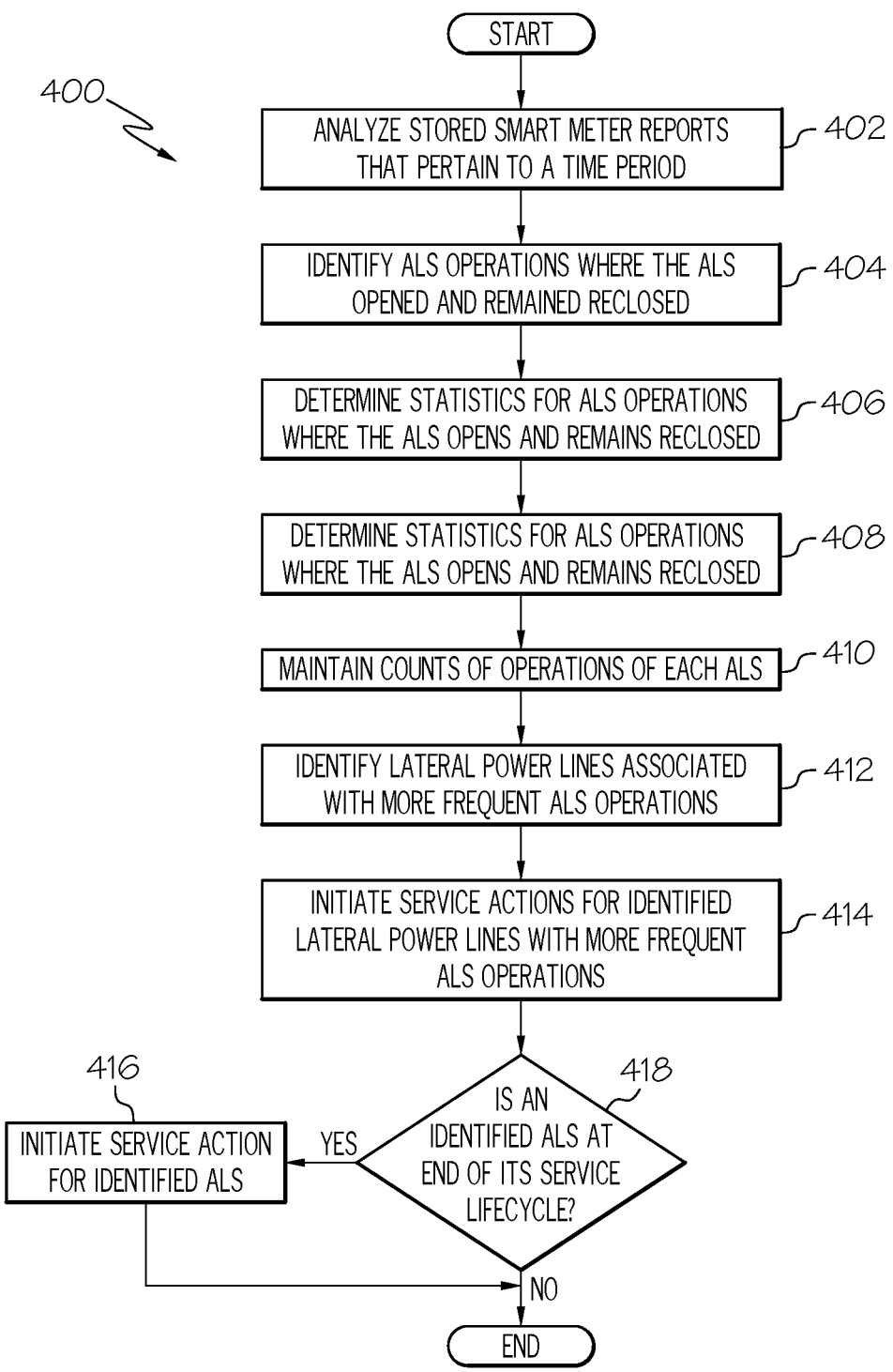
FIG. 4 illustrates an ALS operations analysis process 400, according to an example.

FIG. 4 illustrates an ALS operations analysis process 400, according to an example. The ALS operations analysis process 400 in an example analyses previously received smart meter reports to determine patterns of ALS operations where the ALS opened and remained reclosed. In an example, such reports are stored in the AMI database 164 described above.

The ALS operations analysis process 400 analyzes, at 402, stored smart meter reports that pertain to a time period. In an example, reports that indicate a power down or power restore observation for power delivered to the reporting smart meter. ALS operations where the ALS opens and remains reclosed are then identified, at 404. Identifications of such ALS operations in an example are based on the analyzed smart meter reports such as by the processes described above for the smart meter report monitoring process 200 and ALS operations determination process 300.

Statistics are determined, at 406, for ALS operations where the ALS opens and remains reclosed. Such statistics reflect, for example, repeated operations of an ALS where an overcurrent condition existed, and was cleared within the timeframe of the operation of the ALS. Such situations may indicate that the lateral power feed receiving power through the ALS that opens and remains reclosed has a problem that might be corrected by inspection of that lateral power feed. Such problems may include, for example, vegetation contacting a conductor of the lateral power feed, a structural problem with a component of the lateral power feed, other issues, or combinations of these.

In some examples, statistics are determined, at 408, for ALS operations where the ALS opens but doesn't remain reclosed. These statistics indicate lateral power feeds that have had over current condition that did not clear in time to allow the ALS providing power to that lateral power feed to remain reclosed.

Counts of operations of each ALS are maintained, at 410. Such counts are able to support monitoring of the lifecycle of each ALS. In various examples, such counts are able to be maintained for various types of operations, such as one or more of operations where the contacts of the ALS open and remain reclosed, operations where the ALS remains open, other operations, or combinations of these. Such different operations are able to be accumulated with various levels of description or identifications, such as separate counts for each type of operation, a simple total count of all operations, other levels of detail or combinations of types of operations, or combination of these.

In an example, a remaining service life for a particular ALS may be determined or estimated by comparing the number of determined open occurrences for an ALS with the number of open occurrences rated for that ALS in its lifecycle. In some examples, data within received smart meter messages may be analyzed to estimate a magnitude and duration of one or more overcurrent conditions at different operations of a particular ALS in order to improve a prediction of the lifecycle for that particular ALS, where overcurrent conditions of greater magnitude and or duration may shorten the predicted lifecycle of the ALS.

The ALS operations analysis process 400 identifies, at 412, lateral power feeds that are associated with more frequent ALS operations. This determination is based on the statistics for ALS operations that are determined with the above described processing.

Service actions are initiated, at 414, for the lateral power feeds identified above that have more frequent ALS operations. As discussed above, lateral power feeds that have more frequent ALS operations may have physical problems causing those ALS operations, such as vegetation or other objects causing intermittent or fairly low conduction paths to ground, other physical irregularities, other problems, or combinations of these. Service actions may include, for example, sending personnel to inspect the lateral power feeds and related structures, other actions, or combinations of these.

A determination is made, at 416, as to whether an identified ALS is approaching the end of its service lifecycle. This determination is made, in an example, based upon the above described counts of operations that are maintained for each ALS, at 410. If it is not determined that an identified ALS is approaching the end of its service lifecycle, the ALS operations analysis process 400 ends.

If it is determined, at 416, that an identified ALS is approaching the end of its service lifecycle, an ALS service action is initiated, at 418. In an example, initiating a service action is able to include generating a ticket to replace the identified ALS. In some examples, an identified ALS is able to be a functional reclosing over-current protection device, which is a reclosing over-current protection device that is still functioning and performing its intended purpose. A ticket to replace such an identified ALS is able to be generated based upon its rated lifecycle, even though it is fully functional based upon operational observations. For example, if a particular ALS is rated for a preset number of opening occurrences (e.g., 1000 opening occurrences), and the accumulated statistics determine that 95% of those opening occurrences (or 950) have been detected, then the initiated service action is to replace the still functioning ALS. It is noted that these opening operations of multiple ALS devices, as is determined by the operation of the ALS operations analysis process 400, provides an ability to determine the operations count of various ALS devices and supports more proactive maintenance of an electrical distribution system incorporating the systems and methods described herein. This has the advantage of preventing a future failure of the ALS (that cannot itself communicate its operations or condition via AMI or SCADA systems) prior to exhaustion of its lifecycle, thereby avoiding fault complications resulting from an ALS failing due to an exhausted lifecycle.

In an example, a service action for an identified ALS is able to include generating a ticket to replace a functional reclosing over-current protection device. In an example, processing and systems to generate a ticket to replace a functional reclosing over-current protection device can include receiving a first set of messages received via an Advanced Metering Infrastructure from a number of smart meters that receive electrical power from, i.e., that are downstream of, a functional reclosing over-current protection device, where the functional reclosing over-current protection device is coupled to an electric distribution system and does not communicate over the Advanced Metering Infrastructure (AMI). These processing and systems can further include receiving a second set of messages received from at least one other element that is not downstream of the functional reclosing over-current protection device. The ticket, or other service action, is able to be based upon the first set of messages, the second set of messages, and a predicted lifecycle of the device.

Figure 5:
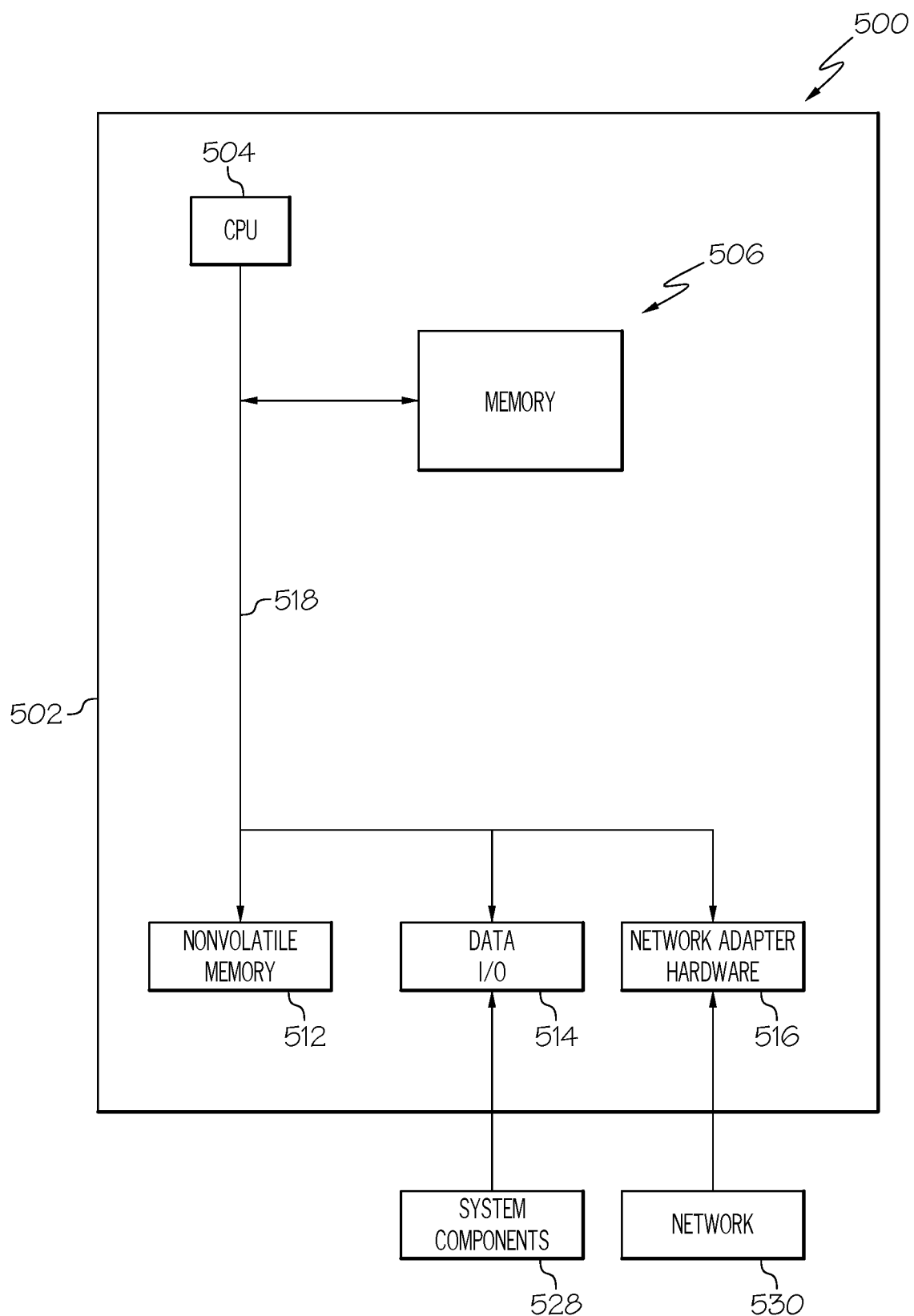
FIG. 5 illustrates a block diagram illustrating a processor, according to an example.

FIG. 5 illustrates a block diagram illustrating a processor 500 according to an example. The processor 500 is an example of a processing subsystem that is able to perform any of the above described processing operations, control operations, other operations, or combinations of these.

The processor 500 in this example includes a CPU 504 that is communicatively connected to a main memory 506 (e.g., volatile memory), a non-volatile memory 512 to support processing operations. The CPU is further communicatively coupled to a network adapter hardware 516 to support input and output communications with external computing systems such as through the illustrated network 530.

The processor 500 further includes a data input/output (I/O) processor 514 that is able to be adapted to communicate with any type of equipment, such as the illustrated system components 528. The data input/output (I/O) processor in various examples is able to be configured to support any type of data communications connections including present day analog and/or digital techniques or via a future communications mechanism. A system bus 518 interconnects these system components.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information. In general, the computer readable medium embodies a computer program product as a computer readable storage medium that embodies computer readable program code with instructions to control a machine to perform the above described methods and realize the above described systems.

Non-Limiting Examples

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A method to detect Automatic Lateral Switch operations, the method comprising:
receiving,
during a time duration at a monitoring facility that is in communications with a number of deployed reporting power meters,
from any subset of reporting power meters in the number of deployed reporting power meters,
a set of power down reports, wherein each power down report in the set of power down reports is sent independently of prior status reporting and independently of querying the subset of reporting power meters from which the set of power down reports is received,
where the subset of reporting power meters from which the set of power down reports is received comprises any combination of a plurality of reporting power meters within the number of deployed reporting power meters that receive power from a lateral power feed receiving power through an identified Automatic Lateral Switch and where that combination of the plurality of reporting power meters, forming the subset of reporting power meters from which the set of power down reports is received, is independent of selection by the monitoring facility, wherein the subset of reporting power meters from which the set of power down reports is received comprises a number of reporting power meters that is:

greater than a lower threshold of reporting power meters that receive power through the identified Automatic Lateral Switch, and fewer than a number of reporting power meters that receive power through the identified Automatic Lateral Switch;

determining, based on receiving the set of power down reports and independently of power down reporting from other power line monitoring equipment, that a state of power on the lateral power feed is down;

receiving, from reporting power meters within a second subset of reporting power meters within a recovery time duration after receiving each power down report of the set of power down reports, respective power restore reports indicating that power is restored at the second subset of reporting power meters, where the second subset of reporting power meters comprises any combination of a plurality of reporting power meters within the number of deployed reporting power meters that receive power from the lateral power feed receiving power through the identified Automatic Lateral Switch;

determining,
  based on the determining that the state of power on the lateral power feed is down, and
  based on receiving the respective power restore reports within the recovery time duration,
  an occurrence of an Automatic Lateral Switch operation of the identified Automatic Lateral Switch, the Automatic Lateral Switch operation comprising operating contacts providing power to the lateral power feed by the contacts opening and remaining reclosed; and storing into a database system, based on determining the Automatic Lateral Switch operation, an indication of the Automatic Lateral Switch operation by the identified Automatic Lateral Switch.

2. The method of claim 1, wherein the set of power down reports comprises a last gasp message.

3. The method of claim 1, wherein the subset of reporting power meters from which the set of power down reports is received comprises at least five (5) reporting power meters.

4. The method of claim 1, wherein the subset of reporting power meters from which the set of power down reports is received comprises at least fifty percent (50%) of the number of deployed reporting power meters that receive power from the lateral power feed receiving power through the identified Automatic Lateral Switch.

5. The method of claim 1, wherein the recovery time duration is less than sixty (60) seconds.

6. The method of claim 1, where an identified substation comprises an overcurrent protection device that drives a feeder line that provides power to the identified Automatic Lateral Switch, and the method further comprising monitoring, at the monitoring facility, for receipt of an indication from Supervisory Control and Data Acquisition (SCADA) equipment at the identified substation that the overcurrent protection device opened during a fault clearing time interval comprising the time duration and the recovery time duration after receiving the set of power down reports, where the determining the occurrence of the Automatic Lateral Switch operation is further based on determining a lack of the receipt of the indication from the Supervisory Control and Data Acquisition (SCADA) equipment at the identified substation that the overcurrent protection device opened.

7. The method of claim 1, further comprising:

monitoring reports received from a second plurality of reporting power meters to determine that a second Automatic Lateral Switch has operated its contacts providing power to a second lateral power feed by the contacts of the second Automatic Lateral Switch opening and remaining reclosed, where the second plurality of reporting power meters receive power from the second lateral power feed receiving power through the second Automatic Lateral Switch that is different than the identified Automatic Lateral Switch, where the lateral power feed and the second lateral power feed both receive electrical power from one substation, the monitoring reports to determine that the second Automatic Lateral Switch has operated its contacts providing power to the second lateral power feed comprising:

receiving, from each respective reporting power meter in a second subset of reporting power meters within the second plurality of reporting power meters, a respective power down report indicating power went down at the respective reporting power meter in the second subset of reporting power meters during the time duration; and receiving, within the recovery time duration after receiving each respective power down report from each respective reporting power meter in the second subset of reporting power meters, at least one power restore report indicating power is restored at any reporting power meter in the second subset of reporting power meters, and where determining the occurrence of the Automatic Lateral Switch operation is further based on the monitoring reports received from a second plurality of reporting power meters failing to determine that the second Automatic Lateral Switch has operated its contacts providing power to the second lateral power feed.

8. The method of claim 1, further comprising:

monitoring reports received from a second plurality of reporting power meters to determine that a second Automatic Lateral Switch has operated its contacts providing power to a second lateral power feed by the contacts of the second Automatic Lateral Switch opening and remaining reclosed, where the second plurality of reporting power meters receive power from the second lateral power feed receiving power through the second Automatic Lateral Switch that is different than the identified Automatic Lateral Switch, where the lateral power feed and the second lateral power feed both receive electrical power from one substation, where determining the occurrence of the Automatic Lateral Switch operation is further based on the monitoring reports received from a second plurality of reporting power meters failing to determine that the second Automatic Lateral Switch has operated its contacts providing power to the second lateral power feed.

9. The method of claim 1, maintaining, based on analysis of data within the database system, a count of a plurality of occurrences of operations of the identified Automatic Lateral Switch;

determining, based on comparing the count to a specified number of lifecycle operation counts associated with the identified Automatic Lateral Switch, that the identified Automatic Lateral Switch is approaching an end of its service lifecycle; and based on determining that the identified Automatic Lateral Switch is approaching the end of its service lifecycle, sending an indication specifying a replacement of the identified Automatic Lateral Switch.

10. The method of claim 1, further comprising:

determining, based on analysis of data within the database system, a pattern of a plurality of occurrences of operations of the identified Automatic Lateral Switch, where each occurrence of an operation in the plurality of occurrences of operations comprises operating contacts providing power to the lateral power feed by the contacts opening and remaining reclosed; and based on the pattern of the plurality of occurrences of operations, sending an indication of required service for the lateral power feed.

11. The method of claim 10, wherein the indication of required service comprises a service ticket specifying an inspection of the lateral power feed.

12. The method of claim 1, further comprising receiving at least one other respective report from at least one other smart meter receiving power from another Automatic Lateral Switch that is different from the identified Automatic Lateral Switch, wherein determining that the state of power on the lateral power feed is down comprises determining, based on receiving the set of power down reports, that the set of power down reports comprises reports from at least the lower threshold of reporting power meters, and wherein determining the occurrence of the Automatic Lateral Switch operation of the identified Automatic Lateral Switch is further based on the receiving the at least one other respective report from the at least one other smart meter receive power from another Automatic Lateral Switch.

13. The method of claim 1, where receiving respective power restore reports comprises receiving a respective power restore report from each reporting power meter in the subset of reporting power meters from which the set of power down reports is received.

14. An Automatic Lateral Switch monitoring processor, comprising:

a processor;

a memory communicatively coupled to the processor;

a database that when operating is configured to store reports received from reporting electrical meters;

a communications network interface, communicatively coupled to the processor, the memory, and a communications network providing communications among a plurality of reporting power meters and the processor, the processor, when operating, being configured to:

receive, during a time duration at a monitoring facility comprising the processor, from any subset of reporting power meters in the plurality of reporting power meters, a set of power down reports, wherein each power down report in the set of power down reports is sent independently of prior status reporting and independently of querying the subset of reporting power meters from which the set of power down reports is received, where the subset of reporting power meters from which the set of power down reports is received comprises any combination of a plurality of reporting power meters within the plurality of reporting power meters that receive power from a lateral power feed receiving power through an identified Automatic Lateral Switch and where that combination of the plurality of reporting power meters, forming the subset of reporting power meters from which the set of power down reports is received, is independent of selection by the monitoring facility, wherein the subset of reporting power meters from which the set of power down reports is received comprises a number of reporting power meters that is:

greater than a lower threshold of reporting power meters that receive power through the identified Automatic Lateral Switch, and fewer than a number of reporting power meters that receive power through the identified Automatic Lateral Switch;

determine, based on receiving the set of power down reports and independently of power down reporting from other power line monitoring equipment, that a state of power on the lateral power feed is down;

receive, from reporting power meters within a second subset of reporting power meters within a recovery time duration after receiving each power down report of the set of power down reports, respective power restore reports indicating that power is restored at the second subset of reporting power meters;

determine, based on the determination that the state of power on the lateral power feed is down, and based on receipt of the respective power restore reports within the recovery time duration, an occurrence of an Automatic Lateral Switch operation, the Automatic Lateral Switch operation comprising clearing a fault on the lateral power feed by opening and closing contacts providing power to the lateral power feed; and store into the database, based on a determination of the Automatic Lateral Switch operation, an indication that the identified Automatic Lateral Switch has operated to clear a fault on the lateral power feed.

15. The Automatic Lateral Switch monitoring processor of claim 14, wherein the lateral power feed comprises a single phase electrical power feed.

16. The Automatic Lateral Switch monitoring processor of claim 14, wherein the subset of reporting power meters from which the set of power down reports is received comprises at least five (5) reporting power meters.

17. The Automatic Lateral Switch monitoring processor of claim 14, wherein the subset of reporting power meters from which the set of power down reports is received comprises at least fifty percent (50%) of the plurality of reporting power meters that receive power from the lateral power feed receiving power through the identified Automatic Lateral Switch.

18. The Automatic Lateral Switch monitoring processor of claim 14, where an the identified substation comprises a overcurrent protection device that drives a feeder line that provides power to the identified Automatic Lateral Switch, the processor being further configured to:

monitor, at the monitoring facility, for receipt of an operations report from the overcurrent protection device that the overcurrent protection device opened during a fault clearing time interval comprising the time duration and the recovery time duration after receiving the set of power down reports, where the processor is configured to determine the occurrence of the Automatic Lateral Switch operation further based on a determination of a lack of receipt of the operations report during the fault clearing time interval.

19. A method comprising:

receiving, independently of querying a subset of smart meters downstream of a functional reclosing over-current protection device, a first set of messages via an Advanced Metering Infrastructure (AMI) system from the subset of smart meters,
- wherein the subset of smart meters comprises any combination of a plurality of smart meters within a number of deployed smart meters that receive power from a lateral power feed receiving power through an identified Automatic Lateral Switch and where that combination of the plurality of smart meters is independent of selection by a monitoring facility;

wherein the subset of smart meters comprises a plurality of smart meters that is greater than a lower threshold of smart meters that receive power through the functional reclosing over-current protection device, and
- wherein the subset of smart meters comprises a number of smart meters that is fewer than a number of smart meters that receive power through the functional reclosing over-current protection device,
- where the functional reclosing over-current protection device is coupled to an electric distribution system and does not communicate over the Advanced Metering Infrastructure system;

determining that the subset of smart meters comprises more than the lower threshold of smart meters;

determining:
- based on determining that the subset of smart meters comprises more than the lower threshold of smart meters,
- based on receiving the first set of messages, and
- independently of power down reporting from other power line monitoring equipment, that a state of power on the lateral power feed is down;

receiving a second set of messages from at least one other element that is not downstream of the functional reclosing over-current protection device; and generating a ticket to replace the functional reclosing over-current protection device based upon the first set of messages, based on the determining that a state of power on the lateral power feed is down, and based on a predicted lifecycle of the functional reclosing over-current protection device.

20. The method according to claim 19, wherein the functional reclosing over-current protection device is an Automatic Lateral Switch (ALS), and
the at least one other element comprises other smart meters that are not downstream from the Automatic Lateral Switch, the other smart meters communicating the second set of messages through the Advanced Metering Infrastructure system.

21. The method according to claim 19,
wherein the functional reclosing over-current protection device is an Automatic Lateral Switch (ALS), and
the at least one other element comprises a protection relay upstream from the Automatic Lateral Switch, the protection relay coupled to a Supervisory Control And Data Acquisition (SCADA) system for communicating the second set of messages, the Supervisory Control And Data Acquisition system being different from the Advanced Metering Infrastructure system, and the Automatic Lateral Switch not being coupled to the Supervisory Control And Data Acquisition system.

* * * * *